United States Patent [19]

Ohba et al.

[11] Patent Number: 4,537,496
[45] Date of Patent: Aug. 27, 1985

[54] METHOD OF REPLENISHING A DEVELOPER FOR PHOTOSENSITIVE PLATE

[75] Inventors: Hisao Ohba; Toshio Uchida; Azusa Ohashi; Nobuyuki Kita, all of Shizuoka, Japan

[73] Assignee: Fuji Photo Film Company, Limited, Kanagawa, Japan

[21] Appl. No.: 443,831

[22] Filed: Nov. 22, 1982

[30] Foreign Application Priority Data

Nov. 30, 1981 [JP] Japan ................. 56-192429

[51] Int. Cl.³ .............................................. G03F 7/00
[52] U.S. Cl. .................................. 355/10; 118/691; 430/300; 430/302
[58] Field of Search .............. 355/3 DD, 14 D, 14 R, 355/10, 14 CH; 430/120, 300, 302, 309, 399, 30; 118/624, 663, 665, 691

[56] References Cited

U.S. PATENT DOCUMENTS

| | | | |
|---|---|---|---|
| 3,970,457 | 7/1976 | Parsonage | 430/399 X |
| 4,123,279 | 10/1978 | Kobayashi | 430/302 |
| 4,193,798 | 3/1980 | Sano et al. | 430/300 |
| 4,239,372 | 12/1980 | Iwai | 355/3 DD X |
| 4,246,335 | 1/1981 | Keogh et al. | 430/300 X |
| 4,259,434 | 3/1981 | Yamasue et al. | 430/302 |
| 4,273,843 | 6/1981 | Fujita et al. | 355/3 DD X |
| 4,288,526 | 9/1981 | Oda et al. | 430/300 X |
| 4,326,646 | 4/1982 | Lavery et al. | 118/691 X |
| 4,348,475 | 9/1982 | Wernicke et al. | 430/399 |
| 4,358,196 | 11/1982 | Mugraver | 430/399 X |
| 4,434,221 | 2/1984 | Oka | 430/30 X |
| 4,435,491 | 3/1984 | Kitamura et al. | 430/302 X |

Primary Examiner—A. C. Prescott
Attorney, Agent, or Firm—Sughrue, Mion, Zinn, Macpeak, and Seas

[57] ABSTRACT

A method of replenishing a developer during the development of photosensitive plates in a conveyor-type automatic developing machine connected to a replenishing device in which the dissolution of the photosensitive layer in the non-image area of a photosensitive plate is measured with a sensor. The sensor is positioned at a certain point in the developing zone of the machine, and, when the measured dissolution reaches a certain level, the replenishing device is automatically actuated to supply a predetermined amount of replenisher to the developer.

21 Claims, 2 Drawing Figures

METHOD OF REPLENISHING A DEVELOPER FOR PHOTOSENSITIVE PLATE

BACKGROUND OF THE INVENTION

1. Field of the Invention

The present invention relates to a method of replenishing a developer during the development of the photosensitive plates in an automatic developing machine. More particularly, the present invention relates to a replenishing method in which the deterioration of the developer due to the processing of the photosensitive plates is measured with a sensor in terms of the dissolution of the photosensitive layer of a specific plate passing through the developing zone of the machine. If the deterioration is found to have reached a certain level, a replenisher is added to the developer to restore the developer to its optimum level.

2. Description of the Prior Art

In processing photosensitive plates in an automatic developing machine, the ability of the developer decreases as the number of the plates to be developed increases. As the processing continues, the ability of the developer to dissolve the non-image area of the photosensitive layer is reduced to the point where insufficient development occurs. Three factors are considered to be responsible for the occurrence of this insufficient development: (1) the material which has dissolved out of the photosensitive layer consumes the effective ingredients of the developer; (2) the developer, if it is an alkali, absorbs carbon dioxide from the surrounding air so that its alkalinity is decreased through neutralization; and (3) the developer, if it is an alcohol, evaporates into the atmosphere. Japanese Patent Application (OPI) No. 144502/75 (the symbol OPI, as used herein, indicates an unexamined, published Japanese patent application), U.S. Pat. No. 4,259,434 and U.K. Patent Application No. 2046931A propose methods for restoring the deteriorated developer by adding a replenishment fluid to the developer collector. The amount of the replenisher to be added depends upon the number of the photosensitive plates processed. As previously mentioned, when a developer made of water and alcohol is used in the automatic processing of photosensitive plates, the alcohol evaporates as time goes by, thus reducing the ability of the developer to dissolve the photosensitive layer of the plates. It is a common practice for those skilled in the art to restore the developer by adding alcohol to make up for the amount evaporated.

U.K. Patent Application No. 2046931A proposes effecting two types of replenishment simultaneously; namely, one replenishment according to the number of the processed photosensitive plates, and the other replenishment on a time basis. More specifically, the first type of replenishment is effected by supplying a replenisher according to the time required for a specific plate to pass through the automatic developing machine. In this method, the amount of replenisher supplied does not vary with the width of the plate or the dimensions of the image area (i.e., the same amount of replenisher is applied to plates of the same length). In the second type of replenishment, a "constant" amount of replenisher is supplied for a given time period, the amount of replenishing agent supplied varying as a function of either the developer in the automatic developing machine or the concentration of carbon dioxide in the air. Therefore, in this developer replenishing method, precise replenishment cannot be accomplished without changing the amount of replenisher provided according to the specific width of a photosensitive plate, the dimensions of the image area, the amount of the developer in the automatic developing machine, or the concentration of carbon dioxide in the air.

A developer made of water and alcohol is conventionally replenished by alcohol in an amount sufficient to maintain the specific density of the developer at a given level. However, the necessary amount of alcohol to be added varies with the amount of developer binder which is dissolved into the processing solution from the photosensitive layer. In addition, the temperature of the developer must be precisely controlled while its specific density is measured. Because of these factors, the exact amount of alcohol to be added is difficult to determine.

SUMMARY OF THE INVENTION

An object of the present invention is, thus, to provide an improved method of replenishing a developer which avoids determining the necessary amount of replenisher as a function of empirical data concerning the processing of the photosensitive plates.

It is another object of the invention to provide means for directly measuring the dissolution of the photosensitive layer during the development operation.

These and other objects of the invention are realized by implementing a replenishing method in which a predetermined amount of replenisher is supplied to the developer through a replenishing device which is coupled to a sensor. The sensor is automatically actuated when the ability of the developer to dissolve the photosensitive layer has been reduced to a given level. The period of development is determined so that the non-image of the photosensitive layer is dissolved to provide an image area which has a predetermined halftone area. For instance, when a positive-acting photosensitive plate, using an O-naphthoquinone-diazide compound, is developed with an aqueous alkaline solution containing an alkali metal silicate for a period of 40 seconds, the photosensitive layer in the non-image area is substantially dissolved within a period of 2 to 10 seconds. In the subsequent development periods, the fringe of each dot is slowly developed until a predetermined halftone area is formed. However, as more plates are developed, more time is required for the non-image area to be dissolved to the point at which a period of more than 40 seconds becomes necessary to produce complete development. As to the quality of the halftone image, up to 25 seconds may be spent in dissolving the non-image area without adversely affecting the image quality, as long as the total development period is 40 seconds. Therefore, the ability of a developer used in the 40-second development can be held constant by checking with a sensor to see if a substantial part of the photosensitive layer has been dissolved within a period of about 25 seconds. If a certain amount of the photosensitive layer remains undissolved, a replenisher is automatically activated to replenish the developer. Specifically, the method of the present invention supplies a predetermined amount of replenisher as a result of direct measurement of the dissolution of the photosensitive layer in this manner. The developing machine is thus capable of producing printing plates with a consistent reproduction of halftone images without accounting for changes in the width of the plates to be processed, the dimensions of the image area, or the concentration of carbon dioxide in the working environment. As a further advantages, the replenishing method of the invention eliminates the need for resetting the amount of the replenisher to be supplied.

DESCRIPTION OF THE PREFERRED EMBODIMENTS

Figure 1:
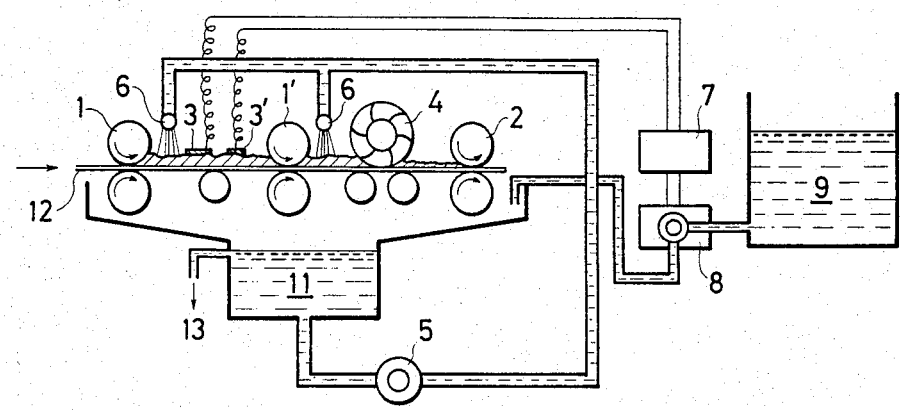
FIG. 1 is a schematic cross-section of an automatic developing machined used in practicing the present invention.

Any one of a number of known sensors which are used for measuring the dissolution of photosensitive layers of a photosensitive plate can be used to effect the replenishing method of the present invention, including (but not limited to): (1) a light-reflecting sensor which either measures the residual amount of a colored photosensitive layer by directing a non-recording beam of light to the layer and converting the intensity of the reflected light into an electrical signal; (2) a light transmission sensor which measures the intensity of light which has been transmitted through a transparent support; (3) an a.c. impedance meter which measures the electrical resistance of the residual photosensitive layer on a metal support; or (4) and a.c. bridge which measures the electrostatic capacity or the equivalent resistance of the residual photosensitive layer.

The light-reflecting sensor can be used when a colored photosensitive layer is coated on an aluminum support. After removing the developer by using a plurality of squeegee rollers or the like, the light reflected from the surface of the aluminum support is measured to produce an output voltage which indicates the amount of the photosensitive layer dissolved in the developer. Any residual photosensitive layer results in a change in the output voltage of the photo sensor. If this change amounts to a given level, the replenishing device is automatically actuated to supply a predetermined amount of replenisher to restore the activity of the developer. The use of an a.c. impedance meter or bridge, on the other hand, is limited to the case in which the support is made of a metal which is conductive. The dissolution of the photosensitive layer on the metal support is measured as the resistance, electrostatic capacitance, or equivalent resistance of the residual photosensitive layer. When the measured value exceeds a certain level, the replenisher is actuated to supply a predetermined amount of replenisher. The advantage of this method are that, unlike the method of using a photo sensor, the developer need not be removed before measurement, and the desired measurement can be made within the developer without contacting the photosensitive plate. For this purpose, one electrode is positioned in the developer about 1 to 50 mm about the coated side of the plate. The other electrode is placed in direct contact with the support by coating a feed roller in the automatic developing machine with a metal. This second electrode need not be in contact with the support and, in this case, it may be in a more "advanced" position with respect to the first electrode (i.e., closer to the exit of the developing zone). Alternatively, the electrodes may be positioned below the side of the plate. In any event, the electrolyte (developer) must be present between the plate and each electrode.

According to the present invention, the sensor is preferably positioned in such a manner that the photosensitive layer within the non-image area of the photosensitive plate is substantially dissolved by a fresh (unfatigued) developer. More specifically, the sensor is positioned at a point within the developing machine at which between 1/20 and $\frac{2}{3}$ of the total development has occurred (as defined by the time required for the plate to travel the distance between the entry and exit ends of the developing zone of a conveyor-type automatic developing machine). Preferably, the sensor is positioned at a point corresponding to 1/12 to $\frac{1}{3}$ of the total development period.

The automatic developing machine used in the present invention is of the conveyor type, and it comprises a developing zone, a cleaning zone (if necessary), a washing zone, a gumming zone and a drying zone. The replenishing device consists of a replenisher tank and a feed pump which is coupled to a timer for supplying a predetermined amount of replenisher.

The photosensitive plate used in the present invention comprises a support such as an aluminum plate, a zinc plate, an iron plate, a paper sheet, or a plastic sheet, which is coated with 5 to 0.1 $g/m^2$ of a photosensitive layer which has a solubility which varies upon illumination. The photosensitive layer typically comprises an orthoquinone diazide compound, a diazonium salt compound, an azide compound, a photocopolymer compound, or a photopolymerizable compound. An optimum photosensitive plate for use in the method of the present invention is a positive-acting, lithographic printing plate which has a photosensitive layer composed of orthoquinone diazide compound on an aluminum support.

The method of the present invention is applicable to a developer which dissolves or removes the photosensitive layer of a plate. If the photosensitive layer is made of an orthoquinone diazide compound, as aqueous solution of sodium or potassium silicate is used. With this developer, a replenisher of higher alkalinity, of the type described in Japanese Patent Application (OPI) No. 144502/75 and U.S. Pat. No. 4,259,434, is used. The amount of replenisher supplied varies with its alkalinity. For easy management of the replenishing operation, a suitable amount of the replenisher ranges from 5 ml to 5 l per 20 l of the developer initially charged in the machine. The optimum range is from 20 ml to 2 l or 20 l of the initial charge.

A negative photosensitive layer, using a diazonium compound which hardens by actinic light, is processed with a developer having a composition which varies with the binder used in the photosensitive layer. If the binder is an alkali-soluble resin, an alkali agent is used as the primary component of the developer. This alkali agent is consumed as more photosensitive plates are processed, and the activity of the developer is decreased accordingly. In this case, the reduced activity can be restored by adding an alkali agent as a replenisher. The same principle applies to other types of photosensitive plates using anazide photosensitive layers, photo-crosslinkable resin layers or photopolymerizable layers which are processed with suitable developers. In each case, the reduced activity of each developer is restored by adding a sufficient amount of material to compensate for the specific component of the developer which has been consumed by the processing of more than one plate. In either case, the dissolution of the photosensitive layer on the plate is directly measured by a sensor, and a suitable replenisher is supplied if the dissolution is found insufficient.

The present invention will now be described in greater detail with reference to the following examples. These examples are given for illustrative purposes only and are by no means intended to limit the scope of the invention.

EXAMPLE 1

A photosensitive solution was prepared by dissolving one part by weight of an ester of naphthoquinone-1,2-diazido-5-sulfonic acid with polyhydroxyphenyl which was a condensation product of acetone and pyrogallol (see Example 8 of U.S. Pat. No. 3,635,709), two parts by weight of a novolak phenol-formaldehyde resin, and 0.02 parts by weight of crystal violet in 20 parts by weight of ethylene glycol monomethyl ether acetate, 10 parts by weight of ethylene glycol monomethyl ether and 10 parts by weight of methyl ethyl ketone. A grained aluminum plate of 0.3 mm thickness was anodized with sulfuric acid to form an oxide film in a weight of about 2.4 g/m$^2$, which was thoroughly cleaned, dried and coated with the previously discussed photosensitive solution. The plate was dried to produce a positive-acting, photosensitive plate which has a photosensitive layer in a weight of about 2.5 g/m$^2$.

The plate was exposed through a positive transparency to a 3 kW metal halide lamp for 60 seconds at a distance of 1 m in such a manner that the area within 5 cm from the edges of the plate was a non-image area. The exposed plate was developed with an automatic developing machine having a developing zone as shown in FIG. 1. A developer tank 11 was charged with 21 l of a developer made of a 3.0 wt.% aqueous solution of potassium silicate ($SiO_2/K_2O = 1.24$). A replenisher tank 9, coupled to a timer switch 8, was filled with a 6.5 wt/% aqueous solution of potassium silicate ($SiO_2/K_2O = 1.24$). The developer was pumped through a spray pipe 6 and sprayed from the pipe onto plate 12, and, thereafter, circulated back to the tank 11. The developing zone of FIG. 1 included plate conveying rolls 1, 1' and 2; a brush roll 4; and stainless steel electrodes 3 and 3'. The electrodes 3, 3' measure 1 cm wide, 2 cm long and 1 mm thick, and are positioned 3 mm above the plate and 2.5 cm inward from the plate edges in transverse directions so that the non-image area is directly under the electrodes. The center of electrode 3 was positioned at a point corresponding to $\frac{1}{8}$ of the total development period defined as the time required for the end of the plate to travel the distance between the center of feed roll 1 and the center of exit roll 2. Since the total development period in Example 1 was 40 seconds, the plate which passed under electrode 3 was developed for 5 seconds. The other electrode 3' was positioned at a point corresponding to a development period of 10 seconds. The impedance of the photosensitive layer was measured by an instrument 7 which consisted of an a.c. impedance meter at a constant current of 10 kHz connected to a sensor switch. The sensor switch 8 was turned on automatically when the impedance was 23 ohms, and replenishing device 8 was actuated to supply 1000 ml of replenisher to the developer tank 11.

When one plate measuring 1003 mm long, 800 mm wide and 0.30 mm thick was processed through the automatic developing machine, almost all of the photosensitive layer in the non-image area dissolved out by the time the plate reached electrode 3, and the impedance meter registered 18 ohms. As expected, the impedance rose as more plates were processed. When 9 plates were processed, the impedance was 23 ohms, indicating the presence of a residual photosensitive layer in the non-image area. The replenishing device was automatically actuated to supply 1000 ml of the replenisher. As a result, the impedance for the next plate dropped to 18 ohms. When 17 plates were processed, the impedance again reached 23 ohms, and 1000 ml of the replenisher was automatically supplied. In this manner, about 200 plates could be processed continuously to produce the corresponding number of printing plates which have good halftone reproducibility.

EXAMPLE 2

Figure 2:
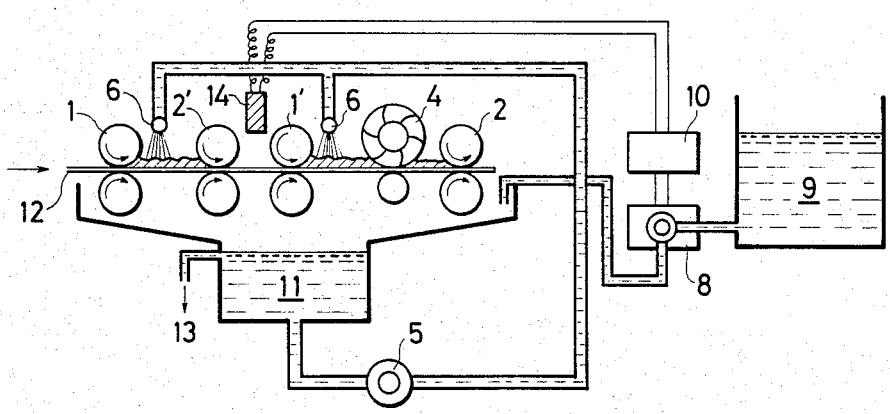
FIG. 2 is a schematic cross-section of another automatic developing machine that can also be used in practicing the present invention.

Exposed photosensitive plates, of the same type used in Example 1, were developed with the same developer and replenished in an automatic developing machine which has a developing zone as shown in FIG. 2. The system of FIG. 2 includes squeegee rolls 1' and 2', a light-reflecting sensor 14 to measure the amount of the residual photosensitive layer, and means 10 consisting of a sensor switch connected to a unit for determining the intensity of reflected light from the sensor as an output voltage. Sensor 14 was positioned at a point 2/5 of the total development zone defined by the distance between feed roll 1 and exit roll 2 (specifically, between squeegee rolls 1' and 2'), and the receiving surface was positioned 12 mm above the plate. As in Example 1, the sensor was positioned so that the non-image area of the plate was constantly sensed by the sensor. A Sankus Corporation Color Mark Sensor LX-12 which has a tungsten lamp as a light source was used as the sensor. The system was designed so that, when the output voltage from the sensor registered 13 on a sensitivity, scale, replenishing switch 8 was automatically actuated to supply 1.5 l of the replenisher to the developer tank 11.

When one photosensitive plate having the same dimensions as those used in Example 1 was processed through an automatic developing machine filled with 21 l of the developer, almost all of the photosensitive layer in the non-image area dissolved out by the time the plate has reached the sensor, and the output voltage from the sensor registered 8 on a sensitivity scale. When 15 plates were processed, the output voltage registered 13, whereupon the replenishing device was automatically actuated to suppply 1.5 l of the replenisher. As a result, the output voltage for the next plate dropped to 9. When 30 plates were processed, the output voltage again rose to 13, and the replenisher was automatically supplied. In this manner, about 200 plates could be processed to produce the corresponding number of printing plates having good halftone reproducibility.

What is claimed is:

1. A method of replenishing a source of developer compound for an automatic image developing machine which develops images upon a plurality of pre-exposed photosensitive plates by depositing said developer compound on said plates as said plates are transported through said machine, said method comprising the steps of:

sensing a residual amount of a photosensitive layer remaining on said photosensitive plates a predetermined period of time after said plates are coated with said developer compound; and sending a predetermined quantity of a replenisher developer compound to said source of developer compound when said residual amount of said photosensitive layer exceeds a predetermined level.

2. The method of claim 1 wherein said predetermined period of time lies between 1/20 and 2/3 of a total development time period for said plates.

3. The method of replenishing a developer compound as recited in claim 2, wherein said predetermined period of time lies between 1/12 and 1/3 of said total development period.

4. An automatic image developing machine for developing images upon a plurality of photosensitive plates comprising:
a housing;
a first source of developer compound;
means for sequentially passing said photosensitive plates through said housing;
coating means within said housing for sequentially coating said photosensitive plates with said developer compound from said source;
a second source of replenisher developer compound in communication with said first source;
sensing means disposed downstream of said coating means for sensing a residual amount of a photosensitive layer remaining on said photosensitive plates; and
means responsive to said sensor signal for transferring a predetermined amount of said replenisher compound from said second source to said first source when said residual amount of said photosensitive layer exceeds a predetermined level.

5. The automatic image developing machine as recited in claim 4, wherein said photosensitive plates comprise an image region and a non-image region, said sensing means sensing said residual amount of said photosensitive layer remaining on said non-image region.

6. The automatic image developing machine as recited in claim 5, wherein said sensing means comprises a plurality of electrodes connected to an impedance meter.

7. The automatic image developing machine as recited in claim 6, wherein said photosensitive plates are developed within a total development period X, one of said electrodes being disposed at a point approximately 1/8 X and another of said electrodes being disposed at a point approximately 1/4 X along the conveyor.

8. The automatic image developing machine as recited in claim 6, wherein said plurality of electrodes are connected to an a.c. bridge which measures the electrostatic capacity of said non-image region.

9. The automatic image developing machine of claim 5, further comprising:
removal means for removing said developer coated on said photosensitive plates, said removal means being disposed between said coating means and said sensing means.

10. The automatic image developing machine of claim 9, wherein said sensing means comprises:
a source of non-image producing light, said light source being directed toward said photosensitive plates; and
a meter which measures said non-image-producing light reflected from said photosensitive plates.

11. The automatic image developing machine as recited in claim 10, wherein said sensing means comprises:
a source of non-image-producing light, said light source being directed toward said photosensitive plates; and
a meter which measures said non-image-producing light transmitted through said non-image region.

12. The automatic image developing machine of claim 11, wherein said photosensitive plates are developed within a total development period X, and wherein said sensing means is disposed at a point approximately 2/5 X along said conveyor.

13. The automatic image developing machine as recited in claim 5, werein said photosensitive layer of said photosensitive plate is selected from one of the members of the group consisting of orthoquinone diazide compounds, diazonium salt compounds and azide compounds.

14. The automatic image developing machine as recited in claim 5, wherein said photosensitive layer of said photosensitive plate comprises a compound selected from one of the members of the group consisting of photopolymer compounds and photopolymerizable compounds.

15. The automatic image developing machine as recited in claim 13, wherein said photosensitive layer further comprises a binder resin.

16. The automatic image developing machine as recited in claim 5, wherein said developer compound comprises a primary agent and at least one secondary agent, said primary agent reacting with said photosensitive layer to dissolve said layers.

17. The automatic image developing machine as recited in claim 16, wherein said replenisher compound comprises said primary agent.

18. The automatic image developing machine as recited in claim 16, wherein said primary agent reacts with said binder resin to dissolve said resin.

19. The automatic image developing machine as recited in claim 4, wherein said predetermined amount of replenisher compound transferred to said first source ranges from 5 ml to 5 l per 20 l of developer initially contained in said first source.

20. The automatic image developing machine as recited in claim 19, wherein said predetermined amount of replenisher compound transferred to said first source ranges from 20 ml to 2 l per 20 l initially contained in said first source.

21. The automatic image developing machine, as recited in claim 17, wherein said primary agent comprises an alkali agent.

* * * * *